US012764466B2

(12) United States Patent
Jacquet et al.

(10) Patent No.: US 12,764,466 B2
(45) Date of Patent: Oct. 13, 2026

(54) METHOD FOR MANAGING THE LOW FREQUENCIES OF A LOUDSPEAKER AND DEVICE FOR IMPLEMENTING SAID METHOD

(71) Applicant: ARKAMYS, Levallois-Perret (FR)

(72) Inventors: Damien Jacquet, Nantes (FR); Maël Pouget, Vayrac (FR)

(73) Assignee: ARKAMYS, Levallois-Perret (FR)

( * ) Notice: Subject to any disclaimer, the term of this patent is extended or adjusted under 35 U.S.C. 154(b) by 124 days.

(21) Appl. No.: 18/728,500

(22) PCT Filed: Jan. 13, 2023

(86) PCT No.: PCT/EP2023/050690

§ 371 (c)(1),
(2) Date: Jul. 12, 2024

(87) PCT Pub. No.: WO2023/135232

PCT Pub. Date: Jul. 20, 2023

(65) Prior Publication Data

US 2025/0113144 A1 Apr. 3, 2025

(30) Foreign Application Priority Data

Jan. 14, 2022 (FR) ........................................ 2200298

(51) Int. Cl.
*H04R 3/00* (2006.01)
*H03G 5/16* (2006.01)
(Continued)

(52) U.S. Cl.
CPC ............. *H04R 3/007* (2013.01); *H03G 5/165* (2013.01); *H04R 1/22* (2013.01); *H04R 3/04* (2013.01); *H04R 3/08* (2013.01); *H04R 2499/13* (2013.01)

(58) Field of Classification Search
CPC ...... H04R 3/007; H04R 3/08; H04R 2499/13; H04R 1/22; H04R 3/04; H03G 5/165
(Continued)

(56) References Cited

U.S. PATENT DOCUMENTS 6,061,455 A * 5/2000 Hadley .................... H03G 7/08 381/109
8,842,845 B2 * 9/2014 Christoph .............. H04S 7/302 381/103

(Continued)

FOREIGN PATENT DOCUMENTS

EP 0817374 9/2003
FR 3018025 8/2015

(Continued)

OTHER PUBLICATIONS

International Search Report for application No. PCT/EP2023/050690 dated Mar. 16, 2023.

*Primary Examiner* — Vivian C Chin
*Assistant Examiner* — Douglas J Suthers
(74) *Attorney, Agent, or Firm* — Perman & Green, LLP

(57) ABSTRACT

A method for managing low frequencies of a loudspeaker located on board a vehicle. The method includes: a step of calibrating an audio system of the vehicle including the loudspeaker, to achieve a set of specifications; a step of measuring acoustic indicators of the loudspeaker including distortion indicator, the measuring step including a step of characterizing the loudspeaker by means of a measuring system, a step of determining a frequency response of the audio system at each volume level, a step of determining a distortion indicator and an indicator of unwanted vibrations for each volume level; a step of managing low frequencies, employing the acoustic indicators, the frequency response at each volume level and the indicators of unwanted vibrations, (Continued)

in the course of which step rendering of the low frequencies by the loudspeaker is optimized. A device for implementing the method is also provided.

15 Claims, 5 Drawing Sheets

(51) Int. Cl.
*H04R 1/22* (2006.01)
*H04R 3/04* (2006.01)
*H04R 3/08* (2006.01)

(58) Field of Classification Search
USPC ........................................... 381/55, 101, 103
See application file for complete search history.

(56) References Cited

U.S. PATENT DOCUMENTS

| | | | | |
|---|---|---|---|---|
| 2010/0290643 | A1* | 11/2010 | Mihelich | H04S 7/301 381/103 |
| 2014/0341394 | A1* | 11/2014 | Croft, III | H04R 3/04 381/102 |
| 2017/0019732 | A1* | 1/2017 | Mendes | H04R 29/003 |
| 2020/0351585 | A1* | 11/2020 | Böhme | H04R 3/04 |
| 2022/0007121 | A1* | 1/2022 | Sinev | H04R 29/001 |

FOREIGN PATENT DOCUMENTS

| | | |
|---|---|---|
| WO | 2020074522 | 4/2020 |
| WO | 2020256612 | 12/2020 |

* cited by examiner

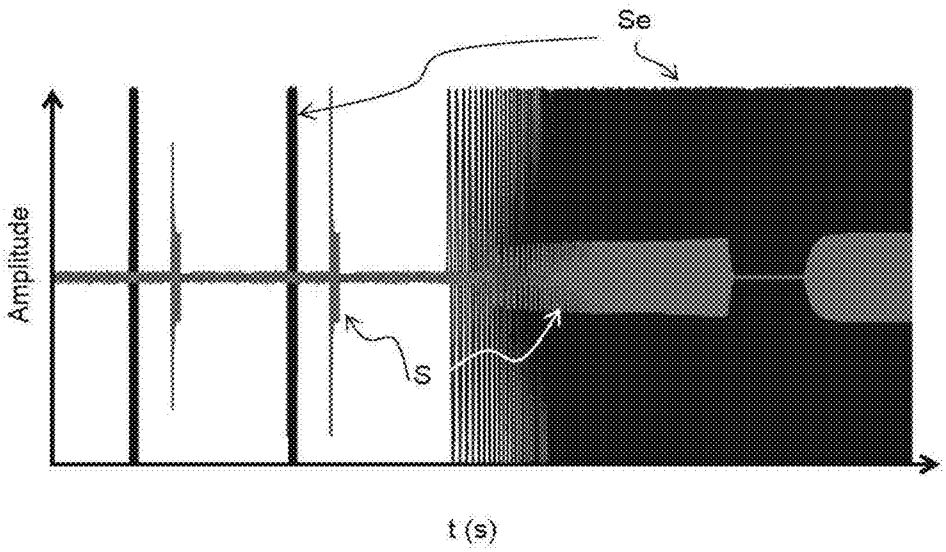
[Fig.3A]
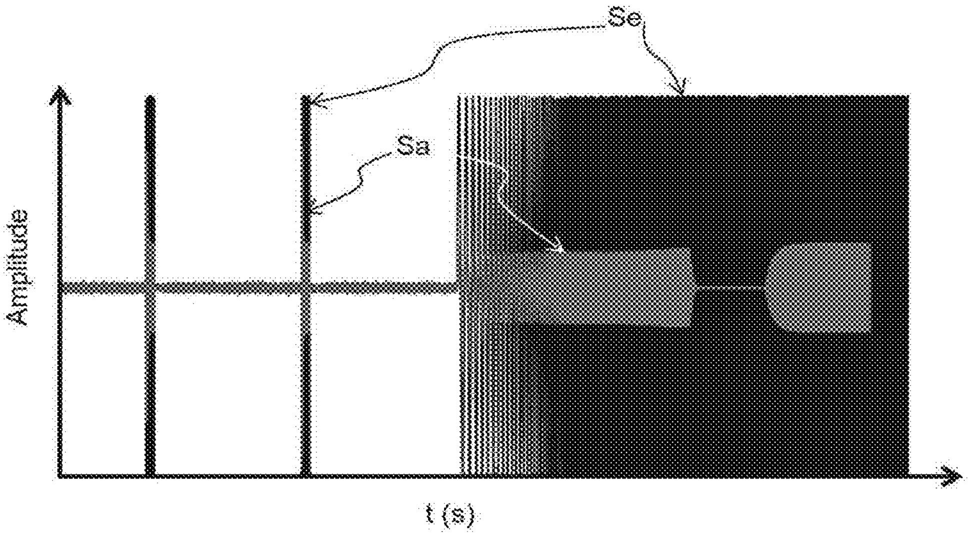
[Fig.3B]

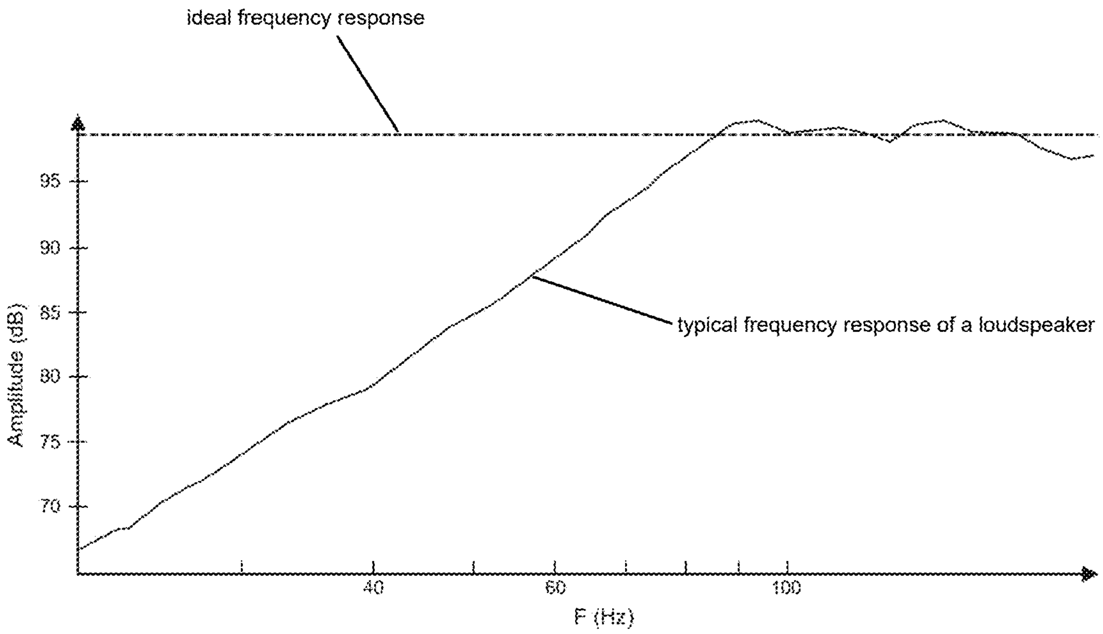
[Fig.4A]
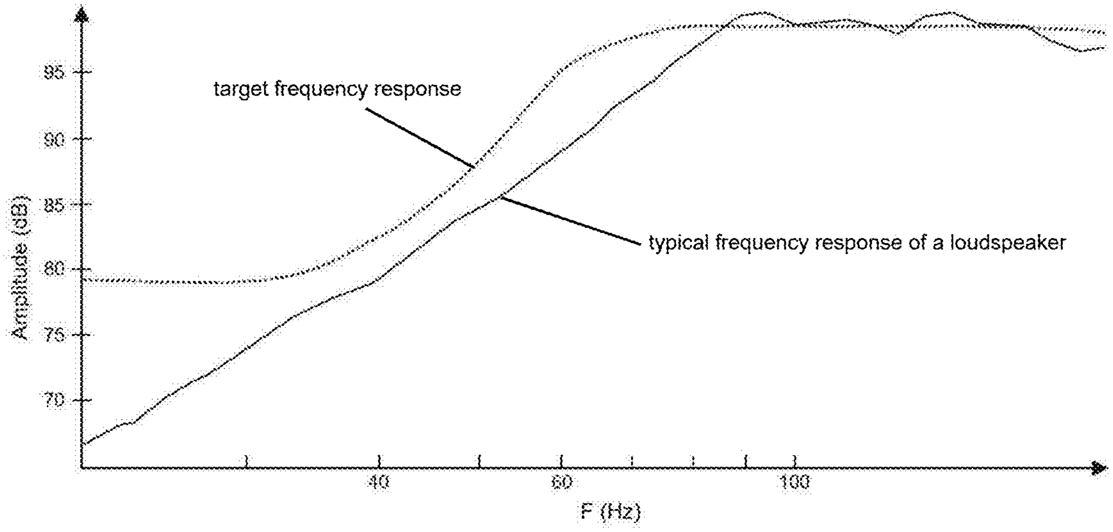
[Fig.4B]

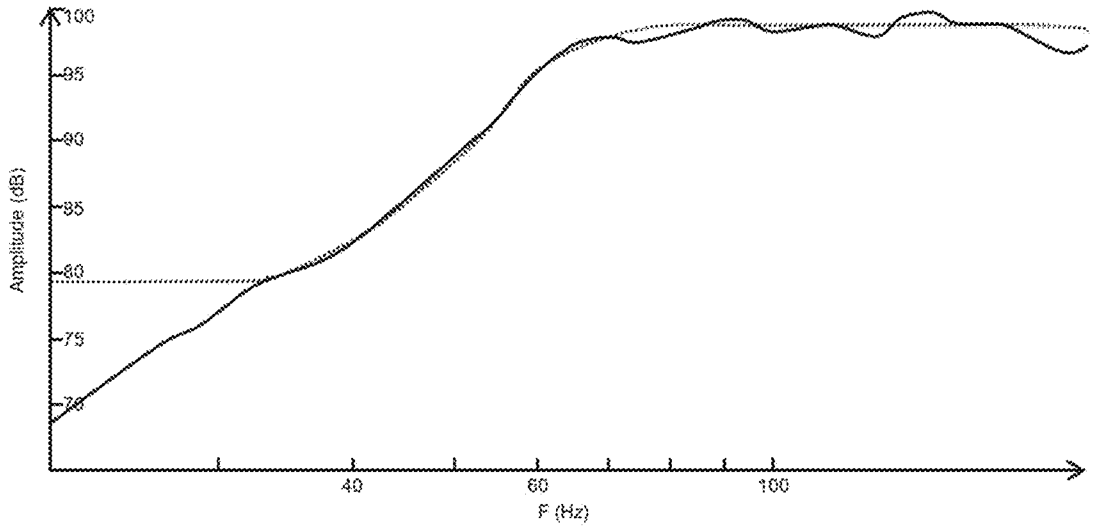
[Fig.5A]
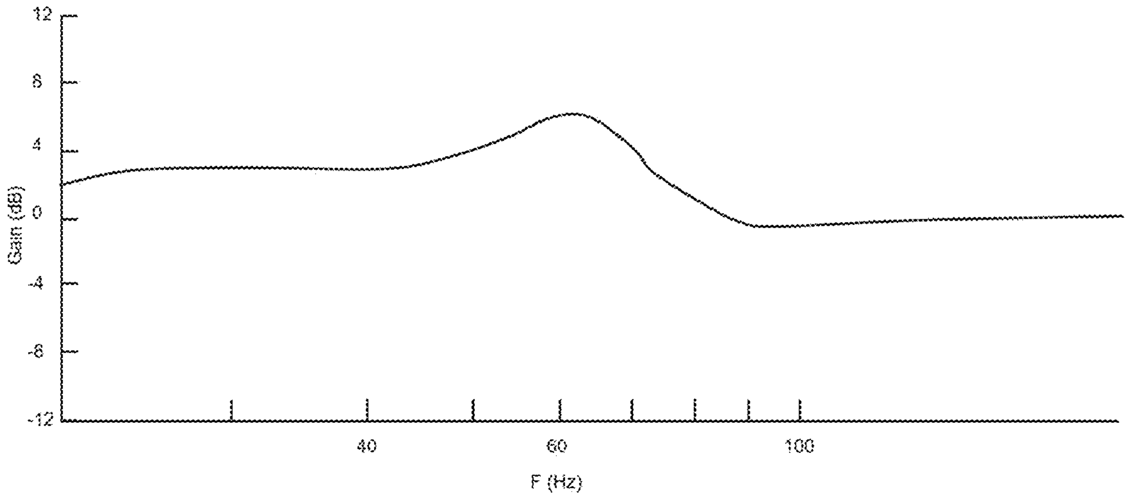
[Fig.5B]

METHOD FOR MANAGING THE LOW FREQUENCIES OF A LOUDSPEAKER AND DEVICE FOR IMPLEMENTING SAID METHOD

CROSS REFERENCE TO RELATED APPLICATONS

This application is a National Stage of International Application No. PCT/EP2023/050690, having an International Filing Date of 13 Jan. 2023, which designated the United States of America, and which International Application was published under PCT Article 21(2) as WO Publication No. 2023/135232 A1, which claims priority from and the benefit of French Patent Application No. 2200298 filed on 14 Jan. 2022, the disclosures of which are incorporated herein by reference in their entireties.

BACKGROUND

Field

The present disclosure relates to a method for managing the low frequencies of a loudspeaker.

More particularly, the present disclosure relates to managing the low frequencies of loudspeakers located on board a vehicle.

The disclosure also relates to a device for implementing said method.

Brief Description of Related Developments

There are in the prior art systems for managing low frequencies in audio systems including loudspeakers.

The international application published under the number WO 2020/256612 A1 discloses the processing of signals broadcast by a plurality of loudspeakers for exploiting the phenomena of interference between the loudspeakers in order to obtain a relative uniform frequency response of the loudspeaker system, in particular in a transition frequency band centred around a cutoff frequency of low-pass and high-pass filters applied to the signals, and with a limited spatial variability in the low frequencies.

The American patent application published under the number US 2020/0351585 A1 discloses an audio system comprising a subwoofer intended for reproducing the low frequencies and a loudspeaker intended for reproducing the high frequencies. The signals intended for the subwoofer and for the loudspeaker are pre-filtered by means respectively of a low-pass filter and a high-pass filter. Combining these prefilterings gives rise to a frequency response having an undulating profile at a transition frequency band centred around a cutoff frequency of the filters. The loudspeaker intended for reproducing the high frequencies has a parameterisable integrated filter for flattening the profile of the frequency response in the transition zone.

The American patent published under the number U.S. Pat. No. 8,842,845 B2 discloses an automatic method for equalising the sound pressure level in the low frequencies, typically for the frequencies lying between 0 and approximately 150 Hz, in particular for making the sound pressure level uniform in the low frequencies, for example in a vehicle, where standing waves may appear and falsify audible perception. For this purpose, an optimum phase separation is applied to one of the signals, determined on the basis of acoustic measurements and minimisation of a difference at a target curve of the sound pressure level.

SUMMARY

The present disclosure proposes an alternative solution to the systems for managing low frequencies rendered by loudspeakers.

The main objectives of the method for managing low frequencies according to the disclosure are:

- extending the bandwidth of the loudspeaker by equalising the frequency response thereof to ensure that it is as flat as possible;
- reducing the distortion phenomenon while increasing the level of the low frequencies;
- protecting the loudspeaker against undesirable phenomena of the type: distortion, unwanted vibrations (known by the term "rattle" in English terminology), etc.

The disclosure relates to a method for managing the low frequencies of a loudspeaker located on board a vehicle and belonging to audio chain of said vehicle having an adjustable volume level. According to the disclosure, the method includes:

- a step of calibrating the audio chain of the vehicle, during which parameters of the audio chain are adjusted to achieve a set of specifications;
- a step of measuring acoustic indicators of the loudspeaker during which a set of acoustic indicators including a distortion indicator are measured, the measurement step including a step of characterising the loudspeaker by means of a measurement system, a step of determining a frequency response of the audio chain at each volume level, a step of determining a distortion indicator and an indicator of unwanted vibrations for each volume level;
- a step of managing the low frequencies, employing said acoustic indicators, the frequency response and the unwanted-vibrations indicator, during which rendering of the low frequencies by the loudspeaker is optimised using the acoustic indicators.

In one aspect, the calibration step comprises:

- a step of determining an acoustic signature of a cabin of the vehicle,
- a step of comparing said measured acoustic signature with a target acoustic signal;
- a step of determining filters for reducing a difference between said measured acoustic signature and said target acoustic signature.

In one aspect, the calibration step comprises a prior pre-adjustment made on adjustable parameters of dimensioning components of the audio chain.

In one aspect, the step of characterising the loudspeaker comprises a calibration of the measurement system and a measurement of the loudspeaker modelling parameters.

In one aspect, the measurement system comprises a laser and a microphone.

In one aspect, the step of determining a frequency response of the audio chain at each volume level comprises the following steps:

- adjusting the volume pitch of the audio system of the vehicle, initially at its minimum value;
- generating an excitation signal allowing frequency exploration;
- measuring the frequency response by means of the microphone;
- measuring an excursion of a membrane of the loudspeaker by means of the laser;

incrementing the volume pitch;

said steps being repeated up to the maximum volume pitch inclusive.

In one aspect, the distortion and unwanted-vibrations indicators are determined by measuring a frequency response by means of the microphone placed at an estimated position of the head of a driver, and comprises the following steps:

measuring a background noise;

adjusting the volume pitch, initially to its minimum value;

generating an excitation signal of the sinusoidal-sweep signal type;

measuring the frequency response by means of the microphone;

measuring the excursion of the membrane by means of the laser;

incrementing the volume pitch;

said steps being repeated up to the maximum volume pitch inclusive.

In one aspect, the measurements made during the step of measuring the acoustic indicators of the loudspeaker are made in open loop, the excitation and measurement signals being realigned timewise before post-processing.

In one aspect, the signals are post-processed by means in particular of short-time Fourier transforms.

In one aspect, the step of managing the low frequencies comprises:

a bandwidth-extension step to bring the frequency response of the loudspeaker closer to a target frequency response;

a loudspeaker protection step.

In one aspect, during the bandwidth-extension step, an acoustic potential is determined, corresponding, for a given frequency and a given operating point of the audio chain, to a maximum amplitude allowed for the signal beyond which the distortion indicator is above a specification for said operating point, said acoustic potential being calculated for each of the volume levels, by comparing the distortion-indicator measurements made during the measurement step with the specification for the volume in question.

In one aspect, during the bandwidth-extension step, an equalisation is applied, for each volume level, to the loudspeaker, a gain of which at a given frequency is given by a difference between the acoustic potential and the frequency response measured during the measurement step.

In one aspect, the equalisation is implemented by means of four filters comprising a high-pass filter and a low-shelf filter used essentially for correcting frequency bands below the cutoff frequency of the loudspeaker, and two filters of the peak type essentially used for correcting a frequency band centred around the cutoff frequency of the loudspeaker, a set of parameters of the filters being initialised and then optimised according to the target frequency response.

In one aspect, the optimisation of the parameters of the filters is implemented iteratively.

In one aspect, during the loudspeaker protection step, a dynamic equaliser is used including at least one filter of the band-stop type each having a predetermined centre frequency and quality factor and a dynamic gain, each of the centre frequencies being defined according to the acoustic phenomenon that it is necessary to control, and said dynamic gain being triggered as soon as the signal passes a threshold value.

In one aspect, the method moreover includes a step of linearising the loudspeaker.

The disclosure also relates to a device for managing the low frequencies of a loudspeaker. According to the disclosure, the device includes:

means for calibrating the audio chain of the vehicle;

means for measuring the acoustic indicators of the loudspeaker;

means for extending the bandwidth of the loudspeaker;

means for limiting the amplitude of the frequencies causing undesirable acoustic phenomena.

In one aspect, the device also includes means for compensating for the nonlinearities of the loudspeaker.

In one aspect, the means for measuring the acoustic indicators of the loudspeaker comprise a microphone and a laser.

BRIEF DESCRIPTION OF THE DRAWINGS

FIG. 3A illustrates a time difference between excitation signals measured during measurements made in open loop in the context of the method according to the disclosure.

FIG. 3B illustrates the signal obtained after synchronisation of the measured excitation signals illustrated on FIG. 3A.

FIG. 4A illustrates a typical frequency response of a loudspeaker, and an ideal frequency response.

FIG. 4B illustrates a target frequency response, defining a target frequency response corresponding to a maximum amplitude enabling the specifications to be satisfied, in terms of mechanical stresses or of distortion caused.

FIG. 5A illustrates the frequency response obtained after optimisation of the filter parameters during the step of extending the bandwidth.

FIG. 5B illustrates the equalisation curve applied for obtaining the frequency response of FIG. 5A.

DETAILED DESCRIPTION

Figure 1:
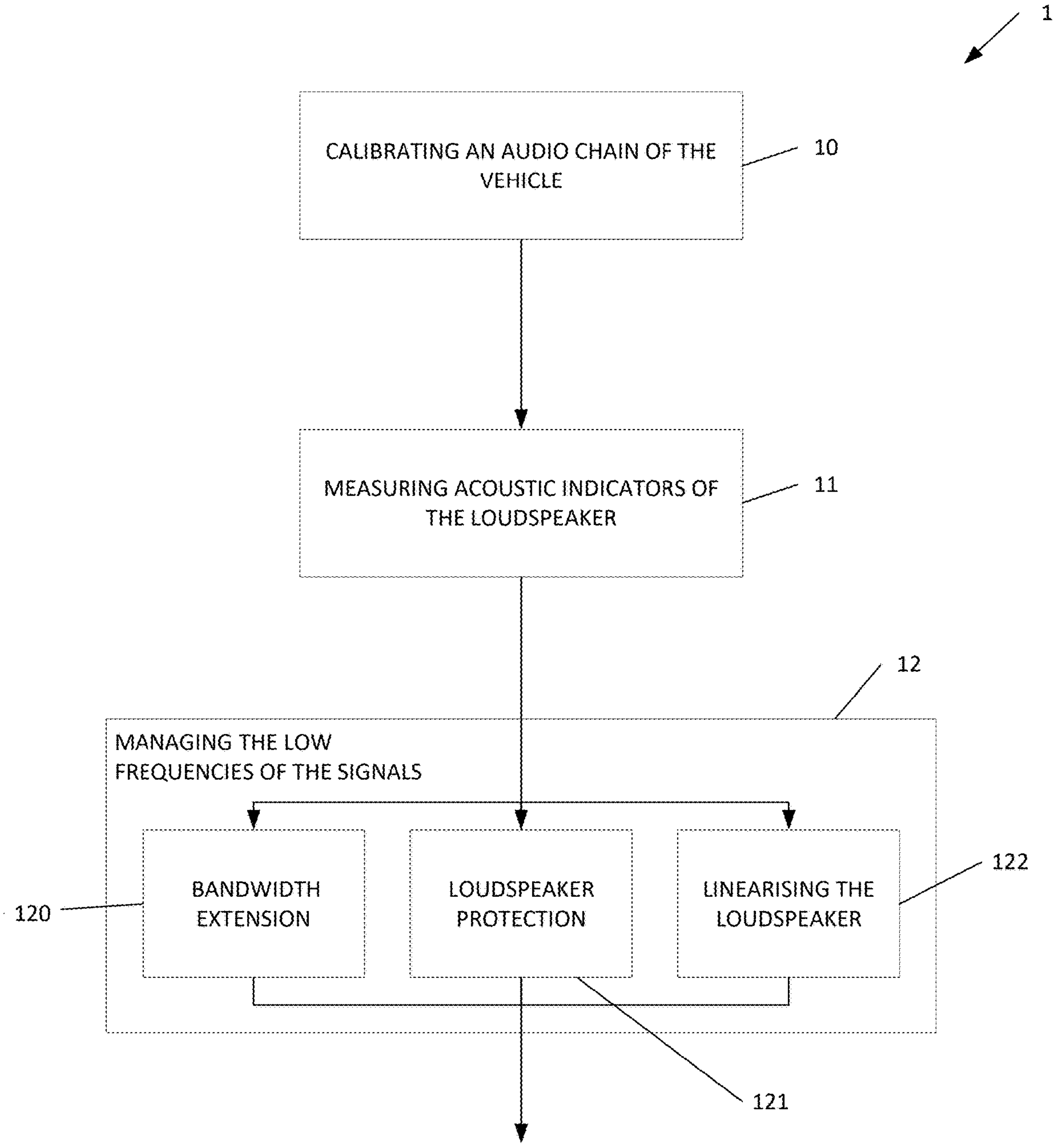
FIG. 1 shows a schematic diagram of the method for managing low frequencies according to the disclosure.

With reference to FIG. 1, the method 1 for managing the low frequencies of a loudspeaker of a vehicle, according to the disclosure, includes the following steps:

a step 10 of calibrating an audio chain of the vehicle;

a step 11 of measuring acoustic indicators of the loudspeaker;

a step 12 of managing the low frequencies of the signals.

The calibration step 10 is a step prior to the implementation of the subsequent steps of the method 1.

During the calibration step 10, the audio chain is parameterised in order to achieve a set of specifications.

"Audio chain" means all the components involved in transmitting and producing sound in the vehicle, from the generation of a single and management thereof in an audio system of the vehicle, as far as the ears of a user of the vehicle.

The components of the audio chain comprise in particular a set of loudspeakers and may moreover comprise, non-exhaustively: volume functions, a digital to analogue converter, digital signal processing functions (for example equalisation, gains, delays), a cabin of the vehicle modelled by an acoustic transfer function, an amplifier.

In particular the audio chain considered in the context of the disclosure includes a certain number of volume levels, for example 30, each corresponding to a degree of attenuation of the signal, generally at the output of the audio chain. The volume level can be modified discreetly by an operator, for example in steps of 1.

Hereinafter, only one loudspeaker is considered, it being understood that the measurements made for one loudspeaker are applied similarly to the other loudspeakers. The disclosure is however not limited to a single loudspeaker.

The specifications for example defined by the manufacturer of the vehicle, or by an entity responsible for an audio service. The specifications define a set of audio criteria necessary for making it possible to achieve sound-reproduction quality objectives. The audio criteria defined in the specifications include for example: sound pressure level (SPL)) at the ears of the driver at a given volume pitch for a given incoming signal, volume law, target frequency response, etc.

The sound-reproduction quality objective to be achieved is generally considered from the point of view of a driver of the vehicle, but may be considered from another point of view, for example the point of view of a passenger.

The specifications are generally defined by a limited set of operating points. "Operating point" means a case of use of the audio system of the vehicle and corresponds to a particular configuration of the audio chain. By way of example, the sound pressure level may be considered solely at maximum volume.

To implement calibration, a preadjustment is made on adjustable parameters of the components dimensioning the chain, i.e. components having the most impact on the sound-reproduction quality. An amplitude of a transfer function of these components is not insignificant in comparison with other components of the audio chain, typically those functions cause a significant modification of the overall sound level, for example a modification greater than 3 dB. Once this preadjustment has been implemented, all the parameters of all the components of the audio chain can be slightly adjusted in order to achieve the criteria defined in the specifications.

It is not necessary at the calibration stage to make a fine adjustment of the parameters.

In one aspect of the method, the calibration step 10 includes:

- a step of determining an acoustic signature of the vehicle cabin, which is fixed in particular by the location of the loudspeakers and the geometry of the cabin;
- a step of comparing said measured acoustic signature with a target acoustic signature;
- determining filters for reducing a difference between said measured acoustic states and said target acoustic signature.

The filters determined in this step make it possible to minimise the difference between the target acoustic feature and the acoustic signature of the vehicle cabin once the filters in question have been applied in the audio chain.

Once the calibration has been done, the measurement step 11 is implemented on the calibrated chain.

Figure 2:
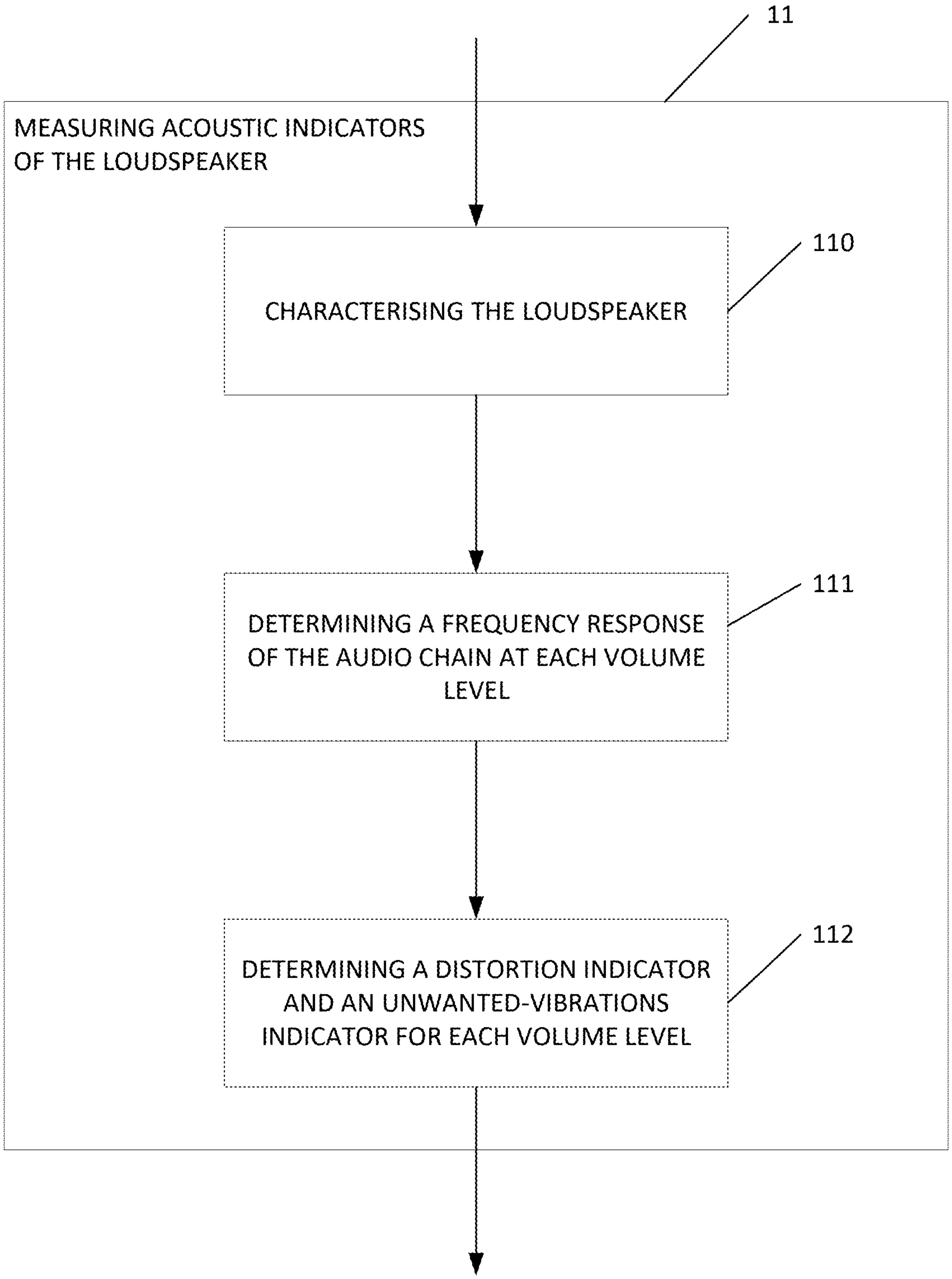
FIG. 2 shows a schematic diagram of the measurement step of the method for managing low frequencies according to the disclosure.

With reference to FIG. 2, the measurement step 11 includes:

- a step 110 of characterising the loudspeaker;
- a step 111 of determining a frequency response of the audio chain at each volume level;
- a step 112 of determining a distortion indicator and an unwanted-vibrations indicator for each volume level.

During the step 110 of characterising the loudspeaker, measuring elements of a measurement system are first of all calibrated.

In the aspect in question, the measuring elements comprise a laser and at least one microphone.

Modelling parameters are next measured, in order to be able to model the behaviour of the loudspeaker.

In one aspect, the modelling parameters include the Thiele and Small parameters, which are measured by means of a low-amplitude excitation signal, for which the response of the loudspeaker is linear, and by means of the measuring elements, here the laser and the at least one microphone, but other measuring elements can be envisaged.

The Thiele and Small parameters include in particular, non-exhaustively: electrical resistance, strength factor, resonant frequency, mechanical compliance. It is thus possible to model the linear behaviour of the loudspeaker, in accordance with a model known to persons skilled in the art. The linear model is used for predicting the behaviour of the loudspeaker for low-amplitude excitation signals.

In one aspect, measurements are also made by means of a high-amplitude excitation signal in order to determine a change in parameters of the loudspeaker from which nonlinearities of the loudspeaker may come. A change in the strength factor, the inductance of the coil and mechanical compliance is in particular determined, according to an excursion x of the membrane of the loudspeaker.

It is thus possible to model the non-linear behaviour of the loudspeaker, in accordance with a model known to persons skilled in the art. The non-linear model is used for predicting the behaviour of the loudspeaker for high-amplitude excitation signals.

Knowledge of the change in the parameters of the loudspeaker giving rise to nonlinearities makes it possible to determine a maximum excursion xmax of the membrane of the loudspeaker beyond which the behaviour of the loudspeaker is non-linear.

The step 110 of characterising the loudspeaker is preferably implemented outside the vehicle, in an acoustic laboratory.

During the subsequent step 111 of determining the frequency response of the audio chain of the vehicle, the frequency response of the audio chain of the vehicle, including the loudspeaker, is measured in situ for each volume pitch of the audio system of the vehicle. "In situ" means that, unlike the step 110 of characterising the loudspeaker implemented in the laboratory, the step 111 of determining the frequency response of the audio chain of the vehicle is implemented in the vehicle cabin.

The following scheme is followed:

- adjusting the volume pitch of the audio system of the vehicle, initially at its minimum value;
- generating the excitation signal, of the sine sweep signal type;
- measuring the frequency response by means of at least one microphone at a listening point specified by the sound-reproduction quality objectives;
- measuring the excursion x, or movement, of the membrane by means of the laser;
- incrementing the volume pitch.

This scheme is thus implemented up to the maximum volume pitch inclusive.

At the end of this step, for each volume pitch, the following are thus obtained:

- the excursion x of the membrane as a function of the amplitude of the excitation signal;
- the frequency response of the loudspeaker.

In a preferred aspect, the excitation signal is a sweep signal acting on a frequency band of interest, for example from 20 Hz to 200 Hz or from 40 Hz to 16,000 Hz.

The amplitude of the excitation signal is also known and depends on the volume of the audio system. The amplitude of the excitation signal is for example equal to −10 dBFS, the unit dBFS designating full-scale dB. The speed of the frequency sweep of the excitation signal depends on the ability of the measuring system to provide exact measurements of the amplitude with the required frequency precision, and must be selected so as to effectively reveal the acoustic phenomena studied (unwanted vibrations for example). A sweep speed of 3 seconds/octave can for example be considered if the measurement system so permits.

During the subsequent step 112 of determining a distortion indicator and an unwanted-vibrations indicator, said indicators are determined for each volume level.

The distortion indicator adopted here is the total harmonic distortion THD ratio, but other indicators may be used, for example the intermodulation distortion IMD level.

The total harmonic distortion THD ratio is measured by placing at least one microphone at an estimated position of the head of the driver, using for example an excitation signal of the sine sweep signal type covering a frequency range from 40 Hz to 16,000 Hz at −10 dBFS.

The following scheme is followed:

- measuring the background noise for correcting future measurements;
- adjusting the volume pitch, initially at its minimum value;
- generating the excitation signal;
- measuring the frequency response by means of the microphone, from which the distortion indicator will be deduced;
- measuring the movement response of the membrane by means of the laser;
- incrementing the volume pitch.

This scheme is thus implemented up to the maximum volume pitch inclusive.

The specifications are given for example for four volume levels of the audio system of the vehicle, determined for example as follows:

- the volume level "V0" must produce a sound level of 65 dB (A) at the ears of the driver when a pink noise is broadcast at −18 dBFS;
- the volume level "V1" must produce a sound level of 75 dB (A) at the ears of the driver when a pink noise is broadcast at −18 dBFS;
- the volume level "V2" must produce a sound level of 85 dB (A) at the ears of the driver when a pink noise is broadcast at −18 dBFS;
- the volume level "V3" corresponds to the maximum volume level of the audio system.

In general, the higher the sound-reproduction quality level sought, the lower the distortion objective sought.

Equally, in general, a higher distortion level can be accepted for high volume levels.

The results of the distortion indicator measurements THD are set out in a three-dimensional distortion matrix, the dimensions of which are respectively the measurement frequencies, the numerical amplitudes of the excitation signal corrected by the volume law, i.e. the attenuation at the volume pitch in question, and the distortion indicators THD measured by means of the frequency response.

The unwanted vibrations (or "rattle") are an undesired audible wide-band noise, radiated by the vibrating structures connected to the loudspeaker that may start to vibrate when it operates at high level.

The unwanted-vibrations indicator adopted here corresponds to an energy Erattle located in all the frequencies beyond the $N^{th}$ harmonic of the excitation frequency of the audio chain. Other indicators can be used, such as the residual distortion level THD+N ("Total Harmonic Distortion plus Noise").

The specifications related to the unwanted vibrations are similar to those of the distortion: the higher the sound-reproduction quality level sought, the lower must be the Erattle energy measured.

In a similar manner to the distortion, the following scheme is followed:

- measuring the background noise for correcting future measurements;
- adjusting the volume pitch, initially at its minimum value;
- generating the excitation signal, for example of the sine sweep signal type;
- measuring the frequency response by means of the microphone, from which the unwanted-vibrations indicator will be deduced;
- measuring the movement response of the membrane by means of the laser;
- incrementing the volume pitch.

This scheme is thus implemented up to the maximum volume pitch inclusive.

The measurements made during the measurement step 11 are generally implemented in open loop, i.e. the excitation signal Se and the measured response S of the loudspeaker or of the audio chain are not synchronised.

FIG. 3A illustrates the time difference between the excitation signal Se and the measured signal S. In order to be able to postprocess the measurement with precision, it is essential to be able to identify, on the measured signal S, the start of the response of the audio chain or of the loudspeaker to the excitation signal.

The excitation Se and measurement S signals are therefore realigned with each other to obtain a resynchronised signal Sa.

For this purpose, the excitation signals used are preceded by a countdown corresponding to a succession of beeps, in order to be able to detect the start of the signal, which is also useful for warning the operators of the start of the measurements.

A time difference, or response delay, between a beep and the response of the audio chain, or of the loudspeaker, to said beep is determined by means of a cross-correlation between the excitation signal Se and the measured signal S.

The excitation Se and measured S signals can thus be realigned, as illustrated on FIG. 3B, either by truncating the measured signal, or by a so-called "zero padding" method applied to the excitation signal.

Once the signals are realigned, the part of the signals corresponding to the "beeps", or to the countdown, is eliminated.

Though making the measurements in open loop simplifies the implementation of the measurements, it should be noted however that, in the context of the disclosure, the measurements made during the measurement step 11 can be made in closed loop if the audio system of the vehicle so permits (the presence for example of a jack socket for injecting an audio signal in real time).

The frequency response of the audio chain, the distortion indicator and the unwanted-vibrations indicator are determined during the determination step 11 by means of a time-frequency analysis.

The structure of the excitation signal being known, it is possible to extract from the measured signal the amplitude of the fundamental of the frequency response, to obtain the transfer function, and from the harmonics to obtain the distortion indicator, and it is possible to implement a wideband analysis of the noise to determine the unwanted-vibrations indicator.

To ensure precision of the amplitudes measured for the distortion indicator THD and the frequency response, a short-time Fourier transform ("STFT") is advantageously used. Alternatively, a wavelet or periodogram transform can be used. In one aspect, the analysis is implemented in octave bands.

For measurements made at low sound pressure levels SPL, or in noisy environments, the background noise may introduce artefacts in the frequency-response, distortion-indicator and unwanted-vibrations indicator measurements.

Advantageously, a measurement of the background noise is made before each measurement, as described previously, thus making it possible to eliminate artefacts in the amplitude measurements, by correcting the measurement, or making it possible to determine a confidence level of the measurement.

It should be noted that a type of excitation signal other than a sine sweep signal can be used. For example, a noise signal, a pulse signal, or more generally any signal allowing frequency exploration on the required frequency band to make the measurement can be used instead of the sine sweep signal.

Once the measurement step 11 has ended, the low-frequency management step 12 is implemented. More particularly, the measurements made during the measurement step 11 (e.g. distortion indicator, frequency response of the audio chain at each volume level and unwanted-vibrations indicator) are used during the low-frequency management step 12.

For example, the low-frequency management step 12 comprises:

a bandwidth extension step 120;

a loudspeaker protection step 121.

During the bandwidth extension step 120, the frequency response of the audio chain is amplified below a cutoff frequency fc of the loudspeaker, so as to extend the bandwidth of said audio chain, and thus to keep a frequency response as flat possible in the low frequencies. The frequency application is constrained in order to limit undesirable phenomena such as distortion or unwanted vibrations related to the mechanical connection with the vehicle (rattle).

FIG. 4A illustrates the typical frequency response of a loudspeaker, shown in a solid line, and an ideal frequency response, shown in a broken line.

FIG. 4B illustrates a target frequency response, shown in a broken line, taking account of the electrical and mechanical stresses of the loudspeaker, in order to limit the phenomena of unwanted vibrations and distortion, and in order to protect the loudspeaker. The target frequency response defines the maximum amplitude for satisfying the specifications, in terms of mechanical stresses and distortion generated, at the volume level in question.

The unwanted-vibrations indicator makes it possible to know whether an unwanted vibration can appear in the new extended band. When the target frequency response is determined, the unwanted-vibrations indicator is taken into account in order to avoid amplifying the unwanted-vibrations phenomena.

For this purpose, an acoustic potential is determined for each operating point. The acoustic potential corresponds, for a given frequency and at the given operating point, to a maximum amplitude allowed for the signal beyond which the distortion indicator is above the specification. The acoustic potential is therefore deduced from the measurements made during the step 112 of determining a distortion indicator.

As seen above, the specifications are generally defined only for a finite number of volume levels. The acoustic objectives for the other volume levels are interpolated from the known specifications, in accordance with each change in the volume law.

By default, the volume level below (and respectively above) the minimum (and respective maximum) volume given by the specifications is associated with the same specifications as the minimum (and respectively maximum) volume level. Another convention can of course be adopted.

Once the specifications have been defined for each volume level, the acoustic potential is calculated for each of said volume levels, by comparing the distortion-indicator measurements made during the measurement step 11 with the specification for the volume in question.

Knowing the acoustic potential and the amplitude of the signal at the operating point in question, which corresponds to the numerical amplitude of the excitation signal corrected by the volume law, i.e. the attenuation at the volume pitch in question, makes it possible to deduce a gain applicable when the signal to be broadcast by the loudspeaker is equalised, taking the difference between the acoustic potential at the volume in question and the amplitude of the excitation signal corrected by the volume law. It should be noted that the gain may be negative if protection of the loudspeaker is necessary.

This is because the measurement of the excursion of the membrane, made in parallel with the measurement of the distortion indicator during the step 112 of determining a distortion indicator, is also compared with the maximum excursion xmax of the loudspeaker determined during the step 110 of characterising the loudspeaker, in order to ensure that the excursion of the loudspeaker does not exceed the maximum excursion.

It should be noted that the presence of a background noise during the measurements is, especially at low volume or if the background noise is great, liable to introduce artefacts into the frequency response of the audio chain. Consequently a fundamental frequency and/or the harmonics thereof are liable to the masked by the background noise to a greater or lesser extent, thus falsifying the result of measuring the distortion indicator, and thus the acoustic potential.

The background noise is therefore preferentially taken into account in the measurements, in order to correct the measured signals.

The maximum gain applicable being known, a set of filters is next used. For each volume level:

a set of filter parameters, comprising for example a centre frequency, a cutoff frequency, a quality factor Q, a gain G and a type of filter, is initialised;

the set of parameters is next optimised, according to the uncorrected frequency response and the target frequency response.

In the example described here, a band equaliser including four bands is used. This equaliser uses a high-pass filter, a filter of the low-shelf type, and two filters of the peak type. Naturally, a different number and/or different types of filters can be envisaged. Moreover, such filters can be implemented in a known manner using an IIR (standing for "Infinite Impulse Response") or IIR (standing for "Finite Impulse Response") digital filter architecture.

The initialisation depends on the type of filter in question, as well as on the uncorrected frequency response and the target frequency response.

Filters of the high-pass and low-shelf types are used mainly for correcting frequency bands below the cutoff frequency of the loudspeaker, and filters of the peak type are mainly used for a frequency band around the cutoff frequency of the loudspeaker.

The gain values of the filters, given for the cutoff frequency or the centre frequency depending on the type of filter, depend on the applicable gain determined by means of the acoustic potential. The gains are for example initialised to the applicable gain values determined previously.

The quality factor is initialised by default at 0.707 for the high-pass and low-shelf filters and at 3 for the filters of the peak type.

Naturally other values can be considered for the initialisation.

The parameters are next optimised iteratively.

It should be noted that, before any correction by equalisation, the distortion indicator is overestimated because of the natural form of the frequency response of the loudspeaker. Consequently the applicable gain is underestimated.

After applying the initialised filters, the frequency response of the loudspeaker tends to flatten, causing a reduction in the value of the distortion indicator THD. This reduction means that an additional gain margin is applicable, while remaining within the specifications.

It is thus possible to adjust, iteratively, the parameters of the filters, and in particular the gain, in order to use the additional gain margin applicable.

On the other hand, beyond a certain number of iterations, the distortion indicator THD increases rapidly, because of the nonlinearities of the loudspeaker.

FIG. 5A and FIG. 5B illustrate an example respectively of the frequency response after the optimisation process and of the equalisation curve applied.

The filters used in the example of FIG. 5A are as follows:

- second-order high-pass filter, having a cutoff frequency at 42 Hz, and a quality factor of 0.7;
- low-shelf filter having a gain of 9 dB at 29 Hz and a quality factor of 0.7;
- a first filter of the peak type having a centre frequency of 11 Hz, an attenuation of 1.6 dB at this frequency, and a quality factor equal to 3;
- a second filter of the peak type having a centre frequency of 63 Hz, zero attenuation at this frequency, and a quality factor equal to 3.763.

The filters used in the example of FIG. 5B or as follows:

- high-pass filter having a cutoff frequency at 23.27 Hz and a quality factor of 0.7;
- low-shelf filter having a gain of 7.038 dB at 25.74 Hz and a quality factor of 0.7;
- a first filter of the peak type having a centre frequency of 83.82 Hz, an attenuation of 3.16 dB at this frequency, and a quality factor equal to 2;
- a second filter of the peak type having a centre frequency of 63.25 Hz, a gain of 7.335 dB at this frequency, and a quality factor equal to 3.1.

In one aspect, the filter parameters obtained at the end of the optimisation of the filter parameters for a given volume level are reused for a lower or higher volume level.

The loudspeaker protection step 121 is implemented downstream of the band extension step 120 so that the gain provided in the low frequencies when the bandwidth is extended is eliminated if it causes vibrations.

The object of this loudspeaker protection step is to limit certain excitation frequencies giving rise to distortion or unwanted vibratory phenomena for example.

Applying static filters for controlling these undesirable phenomena is known. The drawback of such filters is that they alter the signal even if the amplitude levels are low and non-problematic from the point of view of undesirable acoustic phenomena.

During this step, a dynamic equaliser is used and automatically adjusted by virtue of the acoustic characterisation that is made of these undesirable effects.

The advantage of the dynamic equaliser is that it is active only when necessary and does not alter the signal when this is not necessary.

In one aspect, the dynamic equaliser comprises three quadratic filters of the band-stop type each having a constant centre frequency and quality factor, and a dynamic gain. A person skilled in the art will understand that a different number of filters can be used; the types of filter used can also vary.

Each centre frequency is defined according to the phenomenon that it is necessary to control, and the centre frequencies therefore depend in particular on the characteristics of the loudspeaker and the environment thereof (door panel for example).

The dynamic gain is triggered as soon as the signal passes a threshold value, which corresponds for example to the acoustic potential calculated for the distortion indicator THD for the unwanted-vibrations indicator, i.e. the maximum amplitude, at a given frequency, beyond which the specification relating to the acoustic phenomenon concerned is no longer respected.

In one aspect, the method 1 also includes a step of linearising the loudspeaker 122, implemented downstream of the band-extension step 120 and upstream of the loudspeaker-protection step 121.

The object of the loudspeaker-linearisation step is to compensate for the distortions of the signal introduced by the behaviour of the loudspeaker for high-amplitude signals. For this purpose, a non-linear real-time model of the loudspeaker can for example be used. The low-frequency management method according to the disclosure makes it possible:

- to extend the intrinsic bandwidth of the loudspeaker by equalising its frequency response in the low frequencies so that it is as flat as possible, using the entire linear domain of the loudspeaker and limiting the introduction of distortion;
- to reduce the distortion while increasing the level of the low frequencies by compensating for the nonlinearities of the loudspeaker with a pre-corrected signal, based on a non-linear model of the loudspeaker;
- to provide protection against undesirable phenomena of the type: distortion, unwanted vibrations, by applying a dynamic filter limiting the amplitude of certain frequencies, the adjustment of this protection being able to be done by ear or by knowledge of acoustic indicators relating to these phenomena.

The disclosure also relates to a device for managing the low frequencies of a loudspeaker.

The device according to the disclosure includes:

- means for calibrating the audio chain of the vehicle;
- means for measuring the acoustic indicators of the loudspeaker;
- means for extending the bandwidth of the loudspeaker;
- means for limiting the amplitude of the frequencies causing undesirable acoustic phenomena.

In one aspect, the device also includes means for compensating for the nonlinearities of the loudspeaker.

In one aspect, the means for measuring acoustic indicators of the loudspeaker comprise a microphone and a laser.

What is claimed is:

1. A method for managing low frequencies of a loudspeaker located on board a vehicle and belonging to an audio chain of said vehicle having an adjustable volume level having a plurality of predetermined volume levels, said method being characterised in that it includes:

- a step of calibrating the audio chain of the vehicle, during which parameters of the audio chain are adjusted to achieve a set of specifications;
- a step of measuring acoustic indicators of the loudspeaker during which a set of acoustic indicators including a distortion indicator are measured, the measurement step including
  - a step of characterising the loudspeaker by means of a measurement system,
  - a step of determining a frequency response of the audio chain at each predetermined volume level, and
  - a step of determining a-the distortion indicator and an unwanted-vibrations indicator for each predetermined volume level; and
- a step of managing the low frequencies, employing said acoustic indicators, the frequency response at each predetermined volume level and the unwanted-vibrations indicator at each predetermined volume level, during which rendering of the low frequencies by the loudspeaker is optimized;

characterised in that the step of managing the low frequencies comprises:

- a bandwidth-extension step to bring the frequency response of the loudspeaker closer to a target frequency response; and
- a loudspeaker protection step.

2. The method according to claim 1, characterised in that the step of calibrating comprises:

- a step of determining an acoustic signature of a cabin of the vehicle;
- a step of comparing said determined acoustic signature with a target acoustic signal; and
- a step of determining filters for reducing a difference between said determined acoustic signature and said target acoustic signature.

3. The method according to claim 1, characterised in that the step of calibrating comprises a prior pre-adjustment made on adjustable parameters of dimensioning components of the audio chain.

4. The method according to claim 1, characterised in that the step of characterising the loudspeaker comprises a calibration of measuring elements of the measurement system and a measurement of loudspeaker modelling parameters.

5. The method according to claim 1, characterised in that the measuring elements chain comprises a laser and a microphone.

6. The method according to claim 5, characterised in that the step of determining a frequency response of the audio chain at each volume level comprises the following steps:

- adjusting the volume pitch of the audio chain of the vehicle, initially at its minimum value;
- generating an excitation signal allowing frequency exploration;
- measuring the frequency response by means of the microphone;
- measuring an excursion of a membrane of the loudspeaker by means of the laser;
- incrementing the volume pitch;
- said steps being repeated up to the maximum volume pitch inclusive.

7. The method according to claim 5, characterised in that the distortion and unwanted-vibrations indicators are determined by measuring a frequency response by means of the microphone placed at an estimated position of the head of a driver, and comprises the following steps:

- measuring a background noise;
- adjusting the volume pitch, initially to its minimum value;
- generating an excitation signal of the sinusoidal-sweep signal type;
- measuring the frequency response by means of the microphone;
- measuring an excursion of a membrane of the loudspeaker by means of the laser; and
- incrementing the volume pitch;
- said steps being repeated up to the maximum volume pitch inclusive.

8. The method according to claim 7, characterised in that the measurements made during the step of measuring the acoustic indicators of the loudspeaker are made in open loop, the excitation and measurement signals being realigned timewise before post-processing.

9. The method according to claim 8, characterised in that the excitation and measurement signals are post-processed by means in particular of short-term Fourier transforms.

10. The method according to claim 1, characterised in that, during the bandwidth-extension step, an acoustic potential is determined, corresponding, for a given frequency and a given operating point of the audio chain, to a maximum amplitude allowed for the signal beyond which the distortion indicator is above a specification for said operating point, said acoustic potential being calculated for each of the volume levels, by comparing the distortion-indicator measurements made during the step of measuring with the specification for the volume in question.

11. The method according to claim 10, characterised in that, during the bandwidth-extension step, an equalisation is applied, for each volume level, to the loudspeaker, a gain of which at a given frequency is given by a difference between the acoustic potential and the frequency response measured during the step of measuring.

12. The method according to claim 11, characterised in that the equalisation is implemented by means of four filters comprising a high-pass filter and a low-shelf filter used mainly for correcting frequency bands below the cutoff frequency of the loudspeaker, and two filters of the peak type mainly used for correcting a frequency band centred around the cutoff frequency of the loudspeaker, a set of parameters of the filters being initialised and then optimised according to the target frequency response.

13. The method according to claim 12, characterised in that the optimisation of the parameters of the filters is implemented iteratively.

14. The method according to claim 1, characterised in that, during the loudspeaker protection step, a dynamic equaliser is used including at least one filter of the band-stop type each having a predetermined centre frequency and quality factor and a dynamic gain, each of the centre frequencies being defined according to the acoustic phenomenon that it is necessary to control, and said dynamic gain being triggered as soon as the signal passes a threshold value.

15. The method according to claim 1, characterised in that it moreover includes a step of linearising the loudspeaker.

* * * * *